(12) United States Patent
Zaffetti et al.

(10) Patent No.: US 8,804,337 B2
(45) Date of Patent: Aug. 12, 2014

(54) STRUCTURAL ASSEMBLY FOR COLD PLATE COOLING

(75) Inventors: Mark A. Zaffetti, Suffield, CT (US); Edmund P. Taddey, West Springfield, MA (US)

(73) Assignee: Hamilton Sundstrand Space Systems International, Inc., Windsor Locks, CT (US)

( * ) Notice: Subject to any disclaimer, the term of this patent is extended or adjusted under 35 U.S.C. 154(b) by 270 days.

(21) Appl. No.: 13/429,691

(22) Filed: Mar. 26, 2012

(65) Prior Publication Data
US 2013/0250519 A1 Sep. 26, 2013

(51) Int. Cl.
*H05K 7/20* (2006.01)
(52) U.S. Cl.
USPC ........... 361/702; 361/704; 361/707; 361/708; 361/711; 361/713; 165/80.3; 165/80.4
(58) Field of Classification Search
None
See application file for complete search history.

(56) References Cited

U.S. PATENT DOCUMENTS

| | | | |
|---|---|---|---|
| 4,998,181 A | 3/1991 | Haws et al. | |
| 5,991,155 A * | 11/1999 | Kobayashi et al. | 361/705 |
| 6,606,251 B1 * | 8/2003 | Kenny et al. | 361/764 |
| 7,592,695 B2 * | 9/2009 | Reis et al. | 257/706 |
| 7,830,664 B2 | 11/2010 | Campbell et al. | |
| 7,903,411 B2 | 3/2011 | Campbell et al. | |
| 8,089,767 B2 * | 1/2012 | Busch et al. | 361/704 |
| 8,205,337 B2 * | 6/2012 | Lower et al. | 29/890.039 |
| 8,482,921 B2 * | 7/2013 | Cai et al. | 361/700 |
| 8,522,861 B2 * | 9/2013 | Zaffetti et al. | 165/80.4 |
| 2003/0230400 A1 | 12/2003 | McCordic et al. | |
| 2008/0266799 A1 | 10/2008 | Campbell et al. | |
| 2010/0326628 A1 | 12/2010 | Campbell et al. | |
| 2011/0232863 A1 | 9/2011 | Zaffetti et al. | |
| 2011/0232864 A1 | 9/2011 | Zaffetti | |
| 2011/0232879 A1 | 9/2011 | Zaffetti et al. | |
| 2011/0232887 A1 | 9/2011 | Zaffetti et al. | |

* cited by examiner

*Primary Examiner* — Boris Chervinsky
(74) *Attorney, Agent, or Firm* — Cantor Colburn LLP

(57) ABSTRACT

A device including a structural member having a heat spreader and an electronic device mounted directly to a first surface of the heat spreader of the structural member. The device also includes a cold plate mounted directly to the first surface of the heat spreader of the structural member.

20 Claims, 3 Drawing Sheets

STRUCTURAL ASSEMBLY FOR COLD PLATE COOLING

STATEMENT OF GOVERNMENT INTEREST

The invention described herein was made with the support of the United States government under contract number NNJ06TA25C awarded by NASA. The government has certain rights to this invention.

BACKGROUND OF THE INVENTION

The present disclosure relates to cooling for electronic devices, and more specifically, to a structural assembly including a thermal heat spreader for cold plate cooling.

Generally speaking, electronic devices generate heat which can damage the electronic devices if the heat is not dissipated properly. Various cooling technologies have been developed to cool electronic devices including, but not limited to, recirculating chillers, liquid-to-liquid cooling systems, and ambient cooling systems.

Effectively cooling electronic devices is more difficult in environments that have either spatial and/or energy constraints, such as aerospace, aeronautic, or similar applications. Currently, electronic devices used in these types of applications are cooled by mounting the electronic devices to a structural cold plate assembly that uses liquid cooling to remove the heat from the electronic devices. A structural cold plate assembly typically includes a structural member and at least one cold plate attached to the structural member and located directly between the structural member and the electronic device it is cooling. Currently, the location, shape and size of the cold plate are determined by the placement and dimensions of the electronic device the cold plate is cooling. By requiring the cold plate to be located between the structural member and the electronic device the overall thickness of the structural cold plate assembly is increased.

BRIEF DESCRIPTION OF THE INVENTION

In an embodiment, a device is provided that includes a structural member having a heat spreader and an electronic device mounted directly to the heat spreader of the structural member. The device also includes a cold plate mounted directly to the heat spreader of the structural member.

In another embodiment, a device is provided that includes a structural member having a honeycomb structural panel and a first and second heat spreaders affixed to opposing sides of the honeycomb structural panel. The device also includes an electronic device mounted directly to the first heat spreader and a cold plate mounted directly to a same side of the first heat spreader as the electrical device.

In yet another embodiment, a device is provided that includes a structural member having a first and second heat spreaders. The structural member also includes a first fin layer and a second fin layer disposed between the first and second heat spreaders, wherein one or more fins of the first fin layer are oriented in a direction normal to an orientation of one or more fins of the second fin layer. The device also includes an electronic device mounted directly to the first heat spreader and a cold plate mounted directly to the first heat spreader of the structural member.

Additional features and advantages are realized through the techniques of the present disclosure. Other embodiments and aspects of the disclosure are described in detail herein and are considered a part of the claimed disclosure. For a better understanding of the disclosure with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION OF THE INVENTION

Figure 1:
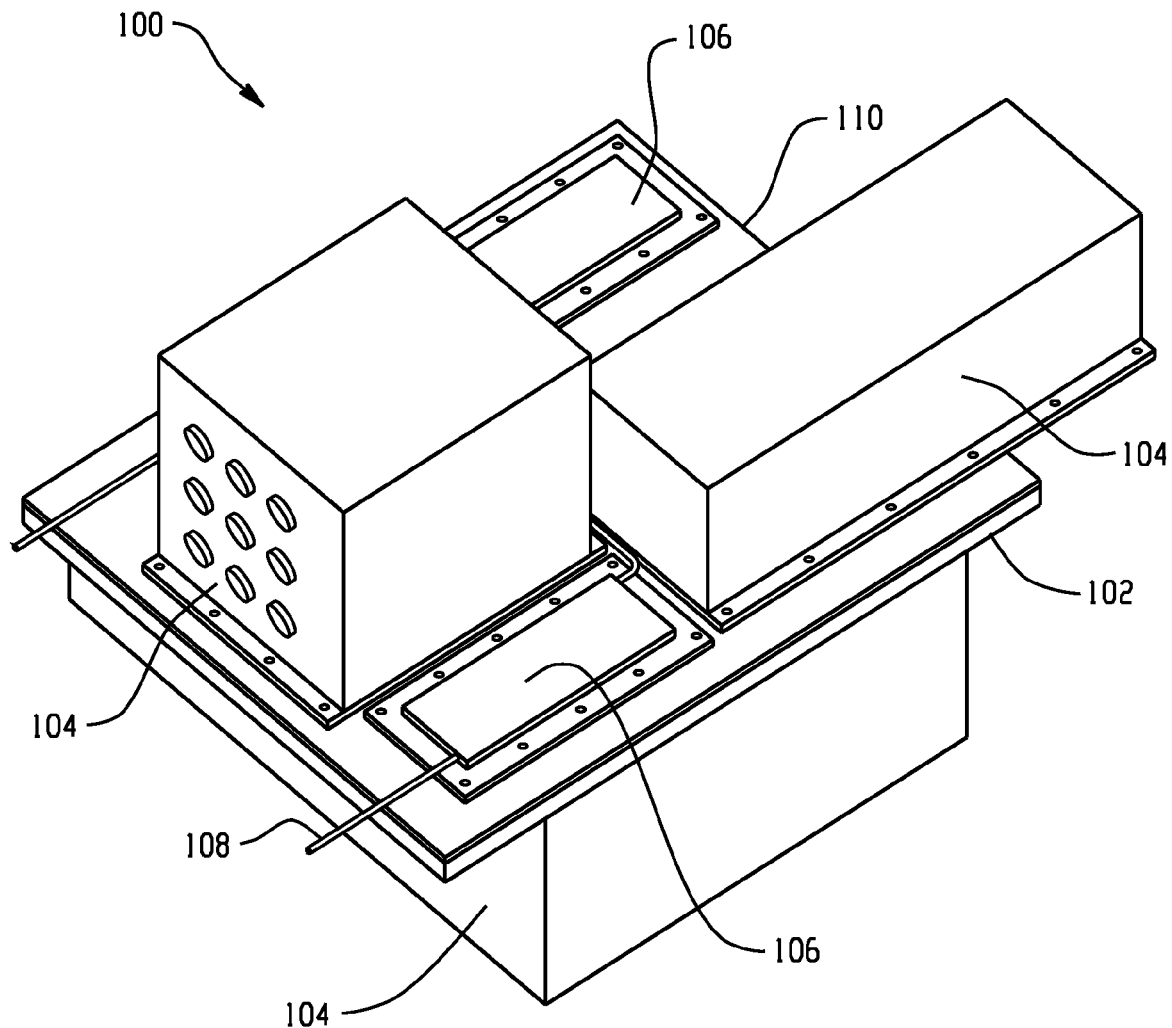
FIG. 1 is a perspective view of a structural assembly including a thermal heat spreader for cold plate cooling in accordance with an embodiment of the disclosure.

Referring to FIG. 1, a structural assembly 100 for cold plate cooling in accordance with an embodiment of the disclosure is shown. The structural assembly 100 includes a structural member 102 having a heat spreader 110 in thermal contact with at least one of the outer surfaces of the structural member 102. The structural assembly 100 also includes one or more electronic devices 104 mounted directly to the heat spreader 110 of the structural member 102. The structural assembly 100 further includes at least one cold plate 106 mounted directly to the heat spreader 110 of the structural member 102. In one embodiment, the cold plate 106 may be a liquid cooled cold plate and structural assembly 100 may include one or more tubes or pipes 108 for exchanging the fluid in the cold plate 106.

In exemplary embodiments, the heat spreader 110 is configured to have a higher lateral thermal conductivity, i.e., thermal conductivity across the surface of the heat spreader 110, than transverse thermal conductivity, i.e., thermal conductivity through the thickness of the heat spreader 110. Accordingly, the heat spreader 110 is configured to efficiently transfer heat from the electronic devices 104 to the cold plates 106. In one embodiment, the heat spreader 110 may be a sheet of annealed pyrolytic graphite, which has a lateral thermal conductivity of approximately 450 Btu/hr/ft/° F. In other embodiments, the heat spreader 110 may be constructed of any suitable material which has a lateral thermal conductivity that is at least twice its transverse thermal conductivity.

By utilizing a heat spreader 110 as an outer layer of the structural member 102, the cold plate 106 can be placed adjacent to the electronic device 104 being cooled rather than directly beneath it. Accordingly, the size and shape of the cold plate 106 can be adjusted to whatever size and shape that is needed to properly cool the electronic devices 104 of the structural assembly 100. In addition, the cold plate 106 can be located in any convenient location on the heat spreader 110. Furthermore, by not requiring the cold plate 106 to be located between the electronic device 104 and the structural member 102, the overall height of the structural assembly 100 can be reduced. By locating the cold plate 106 adjacent to the electronic device 104, rather than underneath the electronic devices 104, the stresses that the cold plate 106 is exposed to are reduced.

Figure 2:
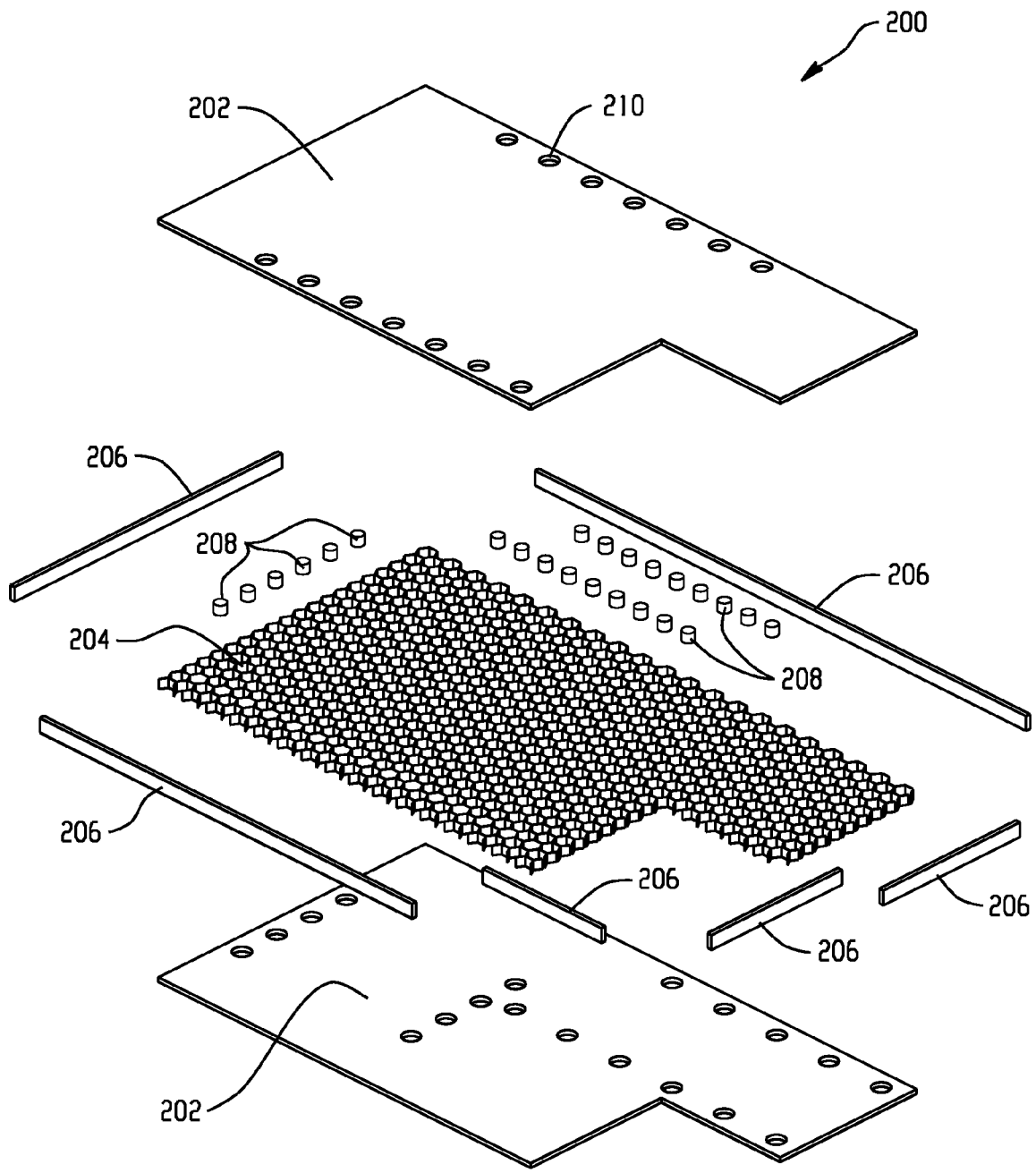
FIG. 2 is an exploded perspective view of one embodiment of a structural member for use in the structural assembly of FIG. 1.

Referring now to FIG. 2, an exploded perspective view of one embodiment of a structural member 200 for use in the structural assembly of FIG. 1 is shown. The structural member 200 includes two heat spreaders 202, which may be configured as opposing outer layers of the structural member 200. The structural member 200 also includes a honeycomb core 204 disposed between the two heat spreaders 202. The honeycomb core 204 is configured to be lightweight and to provide structural rigidity to the structural member 200. In one embodiment, the honeycomb core 204 may be constructed of aluminum. In addition, the structural member 200 also includes a plurality of edge members 206 disposed between the two heat spreaders 202 and along the perimeter of the honeycomb core 204. The structural member 200 may also include a plurality of inserts 208 which can be disposed in honeycomb core 204 and which may be configured to affix one or more electronic devices and/or one or more cold plates to the structural member 200. In one embodiment, the heat spreaders 202 may have one or more apertures 210 through with an electronic device and/or a cold plate can be affixed to one of the inserts 208. In one embodiment, an adhesive can be used to bond the heat spreaders 202 to the honeycomb core 204.

Figure 3:
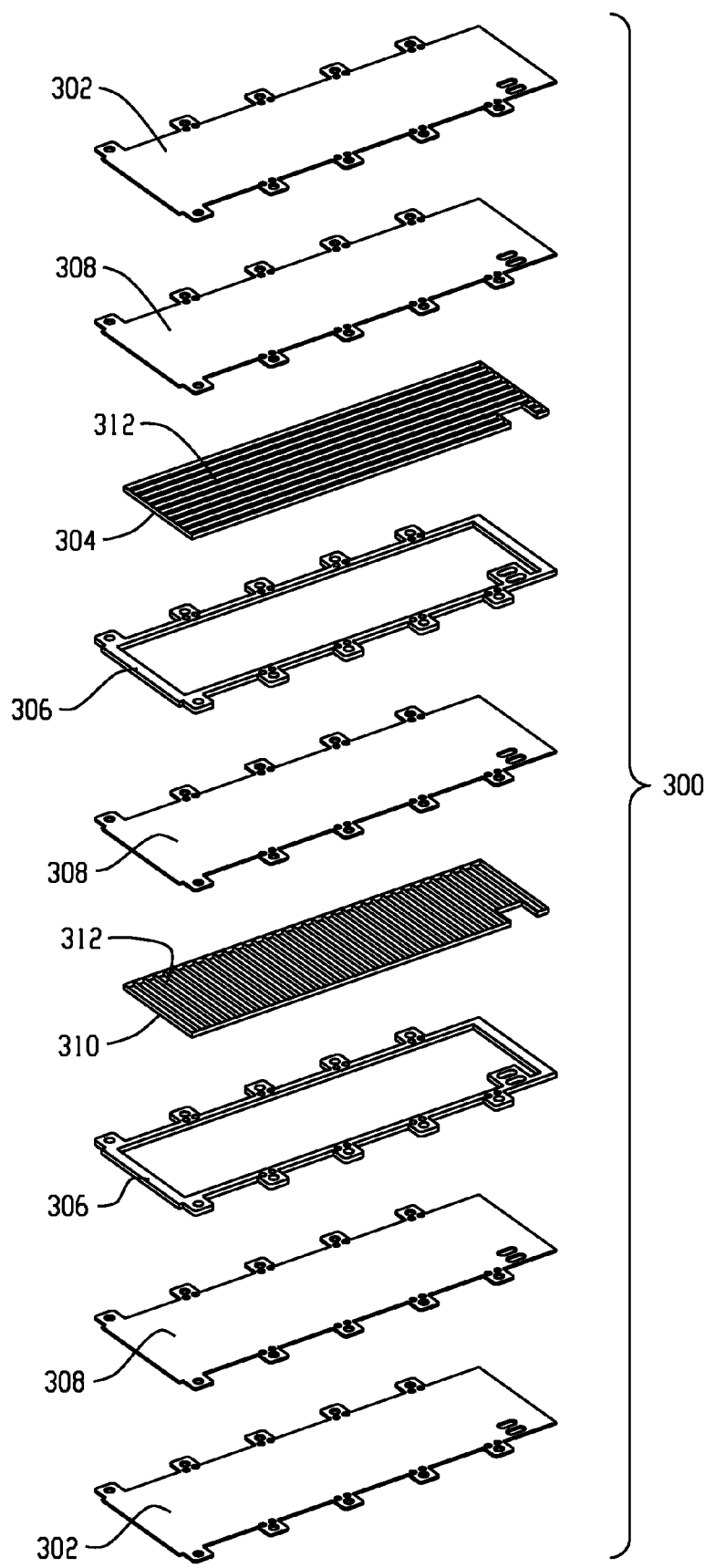
FIG. 3 is an exploded perspective view of another embodiment of a structural member for use in the structural assembly of FIG. 1.

Referring now to FIG. 3, an exploded perspective view of another embodiment of a structural member 300 for use in the structural assembly of FIG. 1 is shown. The structural member 300 includes two heat spreaders 302, which may be configured as opposing outer layers of the structural member 300. The structural member 300 also includes a first fin layer 304 and a second fin layer 310 disposed between the two heat spreaders 302. The first fin layer 304 and second fin layer 310 each include a plurality of fins 312 and the fins of the first layer 304 are configured to have an orientation normal to the orientation of the fins of the second fin layer 310. In one embodiment, the first fin layer 304 and the second fin layer 310 may be constructed of aluminum. The first fin layer 304 and a second fin layer 310 are configured to be lightweight and to provide structural rigidity to the structural member 300. The structural member 300 also includes a parting sheet 308 disposed between the first fin layer 304 and the second fin layer 310. There are also parting sheets 308 between fin layers 304 and the adjacent thermal spreaders 302 and between fin layer 310 and its adjacent thermal spreader 302. The parting sheets 308 contain braze alloy used to braze all of the components together through a vacuum braze process. In addition, the structural member 300 may include one or more frame sections 306 which may be configured to receive the first fin layer 304 and the second fin layer 310 and to affix to the heat spreaders 302 through the parting sheet 308.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

While the preferred embodiment to the disclosure had been described, it will be understood that those skilled in the art, both now and in the future, may make various improvements and enhancements which fall within the scope of the claims which follow. These claims should be construed to maintain the proper protection for the disclosure first described.

The invention claimed is:

1. A device, comprising:
a structural member comprising a heat spreader;
an electronic device mounted directly to a first surface of the heat spreader of the structural member; and
a cold plate mounted directly to the first surface of the heat spreader of the structural member.

2. The device of claim 1, wherein the cold plate is a liquid cooled cold plate.

3. The device of claim 1, wherein the heat spreader is a sheet of annealed pyrolytic graphite having a lateral thermal conductivity of approximately 450 Btu/hr/ft/° F.

4. The device of claim 1, wherein the heat spreader has a lateral thermal conductivity of greater than 90 Btu/hr/ft/° F.

5. The device of claim 1, wherein the cold plate is mounted adjacently to the electronic device.

6. The device of claim 1, wherein the heat spreader has a lateral thermal conductivity that is at least twice its transverse thermal conductivity.

7. A device, comprising:
a structural member comprising:
a honeycomb core; and
a first and second heat spreaders affixed to opposing sides of the honeycomb core;
an electronic device mounted directly to the first heat spreader; and
a cold plate mounted directly to the first heat spreader on a same side as the electronic device.

8. The device of claim 7, wherein the cold plate is a liquid cooled cold plate.

9. The device of claim 7, wherein the first heat spreader is a sheet of annealed pyrolytic graphite having a lateral thermal conductivity of approximately 450 Btu/hr/ft/° F.

10. The device of claim 7, wherein the first heat spreader has a lateral thermal conductivity of greater than 90 Btu/hr/ft/° F.

11. The device of claim 7, wherein the cold plate is mounted adjacently to the electronic device.

12. The device of claim 7, further comprising a plurality of inserts disposed in the honeycomb structural panel configured to affix to the electronic device.

13. The device of claim 7, wherein the heat spreader has a lateral thermal conductivity that is at least twice its transverse thermal conductivity.

14. A device, comprising:
a structural member comprising:
a first and second heat spreaders;
a first fin layer and a second fin layer disposed between the first and second heat spreaders, wherein one or more fins of the first fin layer are oriented in a direction normal to an orientation of one or more fins of the second fin layer;
an electronic device mounted directly to the first heat spreader; and a cold plate mounted directly to the first heat spreader of the structural member.

15. The device of claim 14, wherein the cold plate is a liquid cooled cold plate.

16. The device of claim 14, wherein the first heat spreader is a sheet of annealed pyrolytic graphite having a lateral thermal conductivity of approximately 450 Btu/hr/ft/° F.

17. The device of claim 14, wherein the first heat spreader has a lateral thermal conductivity of greater than 90 Btu/hr/ft/° F.

18. The device of claim 14, wherein the cold plate is mounted adjacently to the electronic device.

19. The device of claim 14, further comprising of parting sheets, containing braze alloy, disposed between the first fin layer and the second fin layer and between the fin layers and the heat spreaders.

20. The device of claim 14, wherein the first heat spreader has a lateral thermal conductivity that is at least twice its transverse thermal conductivity.

* * * * *